US009647692B2

(12) United States Patent
Prodan

(10) Patent No.: US 9,647,692 B2
(45) Date of Patent: May 9, 2017

(54) UPSTREAM FORWARD ERROR CORRECTION CODEWORD FILLING

(71) Applicant: Broadcom Corporation, Irvine, CA (US)

(72) Inventor: Richard S. Prodan, Niwot, CO (US)

(73) Assignee: Avago Technologies General IP (Singapore) PTE. LTD., Singapore (SG)

( * ) Notice: Subject to any disclaimer, the term of this patent is extended or adjusted under 35 U.S.C. 154(b) by 39 days.

(21) Appl. No.: 14/602,174

(22) Filed: Jan. 21, 2015

(65) Prior Publication Data
US 2015/0214981 A1 Jul. 30, 2015

Related U.S. Application Data

(60) Provisional application No. 61/930,953, filed on Jan. 24, 2014.

(51) Int. Cl.
*H03M 13/09* (2006.01)
*H03M 13/17* (2006.01)
(Continued)

(52) U.S. Cl.
CPC .......... *H03M 13/17* (2013.01); *H03M 13/09* (2013.01); *H04B 10/27* (2013.01); *H04L 1/0042* (2013.01);
(Continued)

(58) Field of Classification Search
CPC .. H03M 13/6306; H03M 13/09; H03M 13/17; H04L 1/0057; H04L 1/0083; H04L 1/0042; H04L 25/4908; H04B 10/27
(Continued)

(56) References Cited

U.S. PATENT DOCUMENTS 5,636,208 A * 6/1997 Chang ................... H04L 1/0057
370/347
8,316,286 B2 * 11/2012 Lee ................... H03M 13/2957
714/790

(Continued)

OTHER PUBLICATIONS

Prodan, "FEC Codeword Size Selection Based on Burst Size", accessed on Jan. 23, 2014, pp. 1-15.

(Continued)

*Primary Examiner* — James C Kerveros
(74) *Attorney, Agent, or Firm* — McDermott Will & Emery LLP

(57) ABSTRACT

A device for codeword filling comprises at least one processor circuit. The at least one processor circuit is configured to receive portions of a data burst, encode the portions into blocks, and add the blocks to a buffer. The at least one processor circuit is configured to generate a first codeword from blocks of the buffer when a number of blocks in the buffer satisfies a threshold, remove the blocks from the buffer, and provide the first codeword for transmission. The at least one processor circuit is configured to generate a set of codewords from remaining blocks of the buffer when a marker indicating a data burst end is detected, the set of codewords being determined based at least on a number of the remaining blocks in the buffer when the marker is detected. The at least one processor circuit is configured to provide the set of codewords for transmission.

20 Claims, 10 Drawing Sheets

(51) Int. Cl.
*H04B 10/27* (2013.01)
*H04L 1/00* (2006.01)
*H04L 1/18* (2006.01)
*H04L 25/49* (2006.01)

(52) U.S. Cl.
CPC .......... *H04L 1/1874* (2013.01); *H04L 1/0057* (2013.01); *H04L 1/0083* (2013.01); *H04L 1/1867* (2013.01); *H04L 25/4908* (2013.01)

(58) Field of Classification Search
USPC ........................................................ 714/755
See application file for complete search history.

(56) References Cited

U.S. PATENT DOCUMENTS

| | | | |
|---|---|---|---|
| 2005/0071732 A1* | 3/2005 | Weng | G11B 20/10527 714/770 |
| 2007/0157060 A1 | 7/2007 | Ganga et al. | |
| 2010/0042883 A1* | 2/2010 | Heise | H04L 1/1896 714/748 |
| 2010/0070822 A1* | 3/2010 | Leung | H04L 1/0072 714/752 |
| 2010/0088570 A1* | 4/2010 | Choi | H04L 1/1812 714/751 |
| 2011/0320905 A1 | 12/2011 | Lin et al. | |
| 2012/0110406 A1* | 5/2012 | Sun | H04L 1/0068 714/751 |
| 2013/0346823 A1 | 12/2013 | Cideciyan | |
| 2014/0075264 A1* | 3/2014 | Han | H03M 13/1102 714/758 |
| 2014/0281843 A1* | 9/2014 | Lo | G06F 11/08 714/807 |
| 2014/0337682 A1 | 11/2014 | Prodan | |

OTHER PUBLICATIONS

Prodan, "Upstream FEC Codeword Filling Based on Data Burst Size," Jan. 2014, IEEE Draft, vol. 802.3bn, 13 pages.

Prodan, "EpoC Upstream FEC Efficiency," Jun. 2013, IEEE Draft, vol. 802.3bn, 21 pages.

* cited by examiner

UPSTREAM FORWARD ERROR CORRECTION CODEWORD FILLING

CROSS-REFERENCE TO RELATED APPLICATIONS

The present application claims the benefit of U.S. Provisional Patent Application No. 61/930,953, entitled "Codeword Filling," filed on Jan. 24, 2014, which is hereby incorporated by reference in its entirety for all purposes.

TECHNICAL FIELD

The present description relates generally to codeword filling, including upstream forward error correction codeword filling for transmitter encoding or receiver decoding based on data burst size.

BACKGROUND

Passive Optical Networks (PONs), such as Ethernet Passive Optical Networks (EPONs), are increasingly being deployed to satisfy the growth in residential and commercial demand for bandwidth intensive services, e.g. broadband internet access. An EPON generally consists of optical line terminal (OLT) equipment in a central office and multiple optical network units (ONUs) in the field that are connected by a passive optical connection. The ONUs may be coupled, such as via coaxial transmission networks, to customer equipment of one or more residential or commercial subscribers to the EPON, such that the subscribers may receive bandwidth intensive services. Thus, the network spanning from the OLT to the customer equipment may be referred to as a hybrid fiber-coax (HFC) network.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology. One or more implementations of the subject disclosure are illustrated by and/or described in connection with one or more figures and are set forth in the claims.

Figure 1:
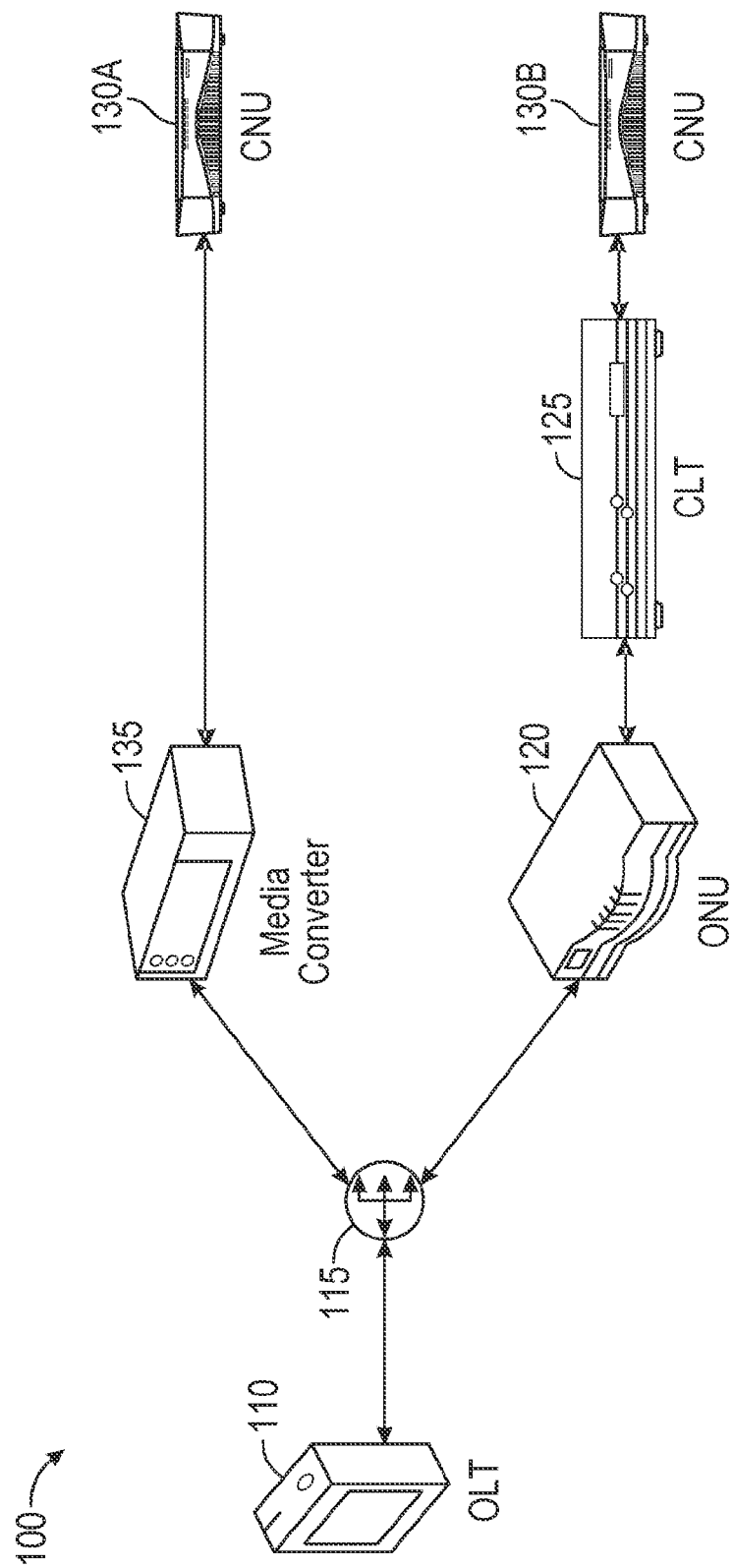
FIG. 1 illustrates an example network environment in which a codeword filling system may be implemented in accordance with one or more implementations.

FIG. 1 illustrates an example network environment 100 in which a codeword filling system may be implemented in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The example network environment 100 includes an optical line terminal (OLT) 110, an optical splitter 115, an optical network unit (ONU) 120, a cable line terminal (CLT) 125, a media converter 135, and one or more cable network units (CNUs) 130A-B. The transmission network from the OLT 110 to the ONU 120 (and to the media converter 135) may be a PON that includes one or more optical network couplings, or adapters, such as the optical splitter 115, and an optical network medium, such as fiber optic transmission lines. The transmission networks from the media converter 135 to the CNU 130A, and from the CLT 125 to the CNU 130B, may respectively include one or more coaxial network couplings, or adapters, and coaxial transmission lines. In one or more implementations, the CNUs 130A-B may be, and/or may include, gateway devices that facilitate local area networks, such as in a dwelling unit.

In the network environment 100, Ethernet passive optical network (EPON) protocol over coax, or EPoC, which refers to the transparent extension of an IEEE Ethernet PON over coaxial transmissions, may be implemented for transmissions over the coaxial transmission networks. Thus, EPoC may be utilized for transmissions between the media converter 135 and the CNU 130A, and for transmissions between the CLT 125 and the CNU 130B. The media converter 135 may be an optical to coaxial media converter that may be referred to as a fiber coax unit (FCU). The media converter 135 converts optical signals received via the PON from the OLT 110 to electrical signals that are transmitted to the CNU 130A via the coaxial transmission network in the downstream direction, and vice-versa in the upstream direction. In one or more implementations, the media converter 135 may act as a repeater that converts between the EPON physical (PHY) layer frames and the EPoC PHY frames (to account for differences in forward error correction (FEC)

encoding and line encoding), while retaining the EPON preamble and logical link identifier (LLID). In this manner, the OLT 110 can provide scheduling and media access control (MAC) directly to the CNU 130A, in a similar manner as scheduling and MAC control are provided to the ONU 120; that is, the CNU 130A effectively appears to the OLT 110 as an ONU 120.

In one or more implementations, the media converter 135 acts as a layer-2 bridge, which receives data packets from the OLT 110 and bridges the received data packets over the coaxial transmission network to the CNU 130A. When acting as a bridge, the media converter 135 may assign an LLID to the CNU 130A and may provide scheduling and MAC control to the CNU 130A. For explanatory purposes, a single CNU 130A is coupled to the media converter 135 in FIG. 1; however, in one or more implementations, multiple CNUs 130A may be coupled to the media converter 135.

The ONU 120 is also coupled to the OLT 110 via the PON and is communicatively coupled to the CLT 125, such as via a high-speed media independent interface. The CLT 125 is coupled to the CNU 130B via a coaxial transmission network. Accordingly, optical signals are converted to electrical signals by one of the ONU 120 or the CLT 125 in the downstream direction, and vice-versa in the upstream direction. In one or more implementations, an intermediary device between the ONU 120 and the CLT 125, such as a media converter 135, may perform the optical to electrical conversion, and vice-versa. For explanatory purposes, a single CNU 130B is coupled to the CLT 125 in FIG. 1; however, in one or more implementations, multiple CNUs 130B may be coupled to the CLT 125.

The subject technology relates to codeword filling for the FEC encoding of the upstream transmissions between devices in the network environment 100 that are implementing EPoC, such as upstream transmissions from the CNU 130A to the media converter 135, and upstream transmissions between the CNU 130B and the CLT 125. The codeword filling for FEC encoding in the upstream direction is dependent on the actual MAC data burst length, e.g. such that the appropriate codeword sizes may be selected. The codeword sizes utilized by the subject technology may include, for example, shortened short, short (or full short), shortened medium, medium (or full medium), shortened long and long (or full long). However, in EPoC, the data burst length is not communicated from the MAC layer to the PHY layer where the FEC encoder resides. Thus, the CNUs 130A-B encode data bursts in the upstream transmission channel on-the-fly, e.g. without a priori knowledge of data burst size. Since the sizes of the data bursts are not known a priori, the CNUs 130A-B may use data burst markers for demarcation of the data burst boundaries.

The subject technology allows the CNUs 130A-B to efficiently encode and/or decode variable sized FEC codewords for the MAC data bursts, on-the-fly without a priori knowledge of data burst size, and in a manner that substantially maximizes the aggregate code rate. In this regard, the subject technology provides for selecting, combining, and/or shortening of multiple FEC codeword sizes and/or rates that improves and/or maximizes overall efficiency, such as by improving the aggregate code rate. The subject technology also mitigates the sparse last shortened FEC codeword decoding problem (where the last codeword includes a very small number of bits), such as by employing codeword filling that utilizes mixed codeword sizes for the last shortened codeword. The mixed codeword sizes may be determined in a manner that maintains the aggregate code rate.

Thus, the subject technology provides a reversible upstream FEC encoding and decoding procedure that can be used to encode and/or decode multiple size FEC codewords for a variable size data burst where the number of codewords to be encoded or decoded is based on a data burst size that the encoder and/or decoder does not have a priori knowledge of.

Figure 2:
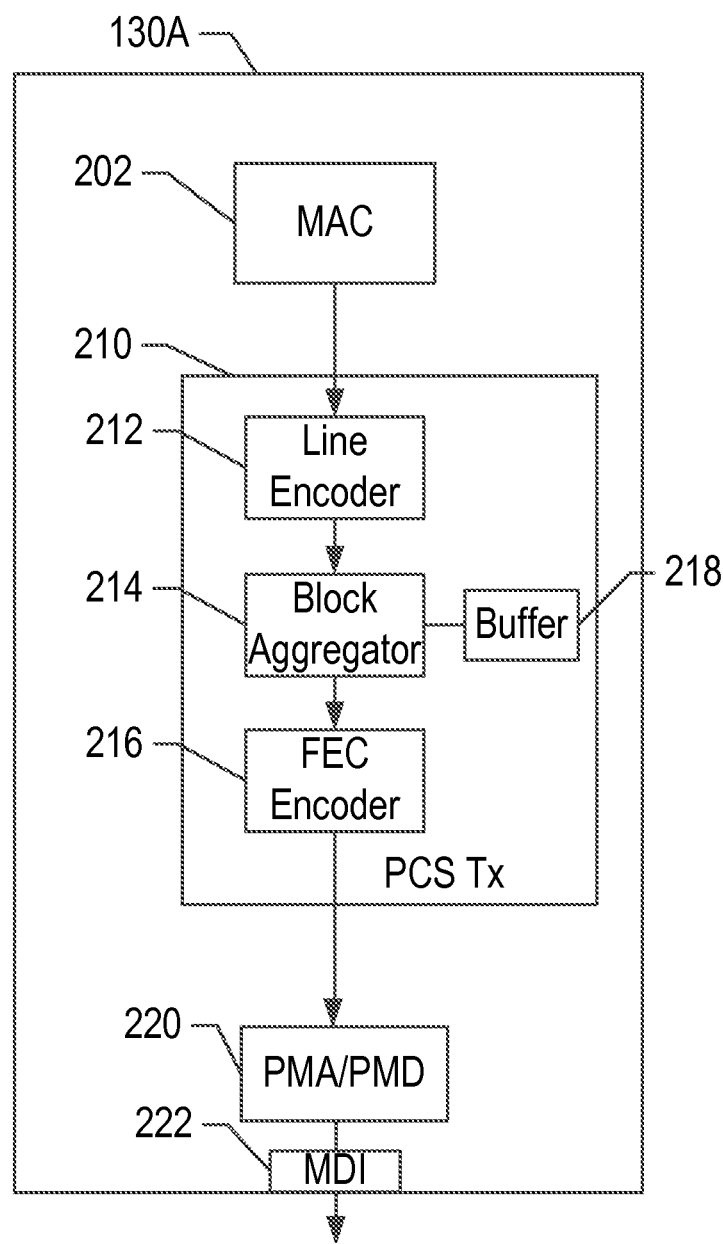
FIG. 2 illustrates an example cable network unit (CNU) in accordance with one or more implementations.

FIG. 2 illustrates an example cable network unit (CNU) 130A in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided. For explanatory purposes, the CNU 130A is illustrated in FIG. 2; however, the same and/or similar components may be used in the CNU 130B, and other CNUs.

The example CNU 130A includes a MAC module 202, a physical coding sublayer (PCS) transmit (Tx) module 210, a physical medium attachment (PMA)/physical medium dependent (PMD) module 220, and a media dependent interface (MDI) 222. The PCS Tx module 210 may include a line encoder 212, a block aggregator 214, and an FEC encoder 216. The block aggregator 214 may be coupled to, and/or may include, a buffer 218. In one or more implementations, the FEC encoder 216 may be a low-density parity check (LDPC) FEC encoder.

The line encoder 212 receives MAC data bursts from the MAC module 202 and converts the data bursts into blocks. The blocks may consist of a fixed number of bits. In one or more implementations, the line encoder 212 is a 64B/66B line encoder that receives 64-bit portions of a data burst and generates 65-bit blocks. The block aggregator 214 receives the blocks from the line encoder 212, and aggregates the blocks, e.g. in the buffer 218, into FEC payloads, while monitoring for the end burst marker in the received blocks. The block aggregator 214 provides the aggregated blocks, as FEC payloads (e.g., including a cyclic redundancy check (CRC) value), to the FEC encoder 216. In order to maximize efficiency, the block aggregator 214 aggregates the blocks into FEC payloads corresponding to long codewords, when possible. When the block aggregator 214 detects the end burst marker, the block aggregator 214 parses the blocks remaining in the buffer 218 into codewords in a manner that maximizes efficiency, as is discussed further below with respect to FIGS. 4A-B and 5. The codewords output by the FEC encoder 216 may be further processed by the PCS Tx module 210, and are then provided to the PMA/PMD module 220, and subsequently transmitted over the MDI 222, such as a coaxial connector.

In one or more implementations, one or more of the MAC module 202, the PCS Tx module 210, the line encoder 212, the block aggregator 214, the FEC encoder 216, and/or the buffer 218 may be implemented in software (e.g., subroutines and code). In one or more implementations, one or more of the MAC module 202, the PCS Tx module 210, the line encoder 212, the block aggregator 214, the FEC encoder 216, the buffer 218, the PMA/PMD module 220, and/or the MDI 222 may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or a combination of both. Additional features and functions of these modules according to various aspects of the subject technology are further described in the present disclosure.

Figure 3:
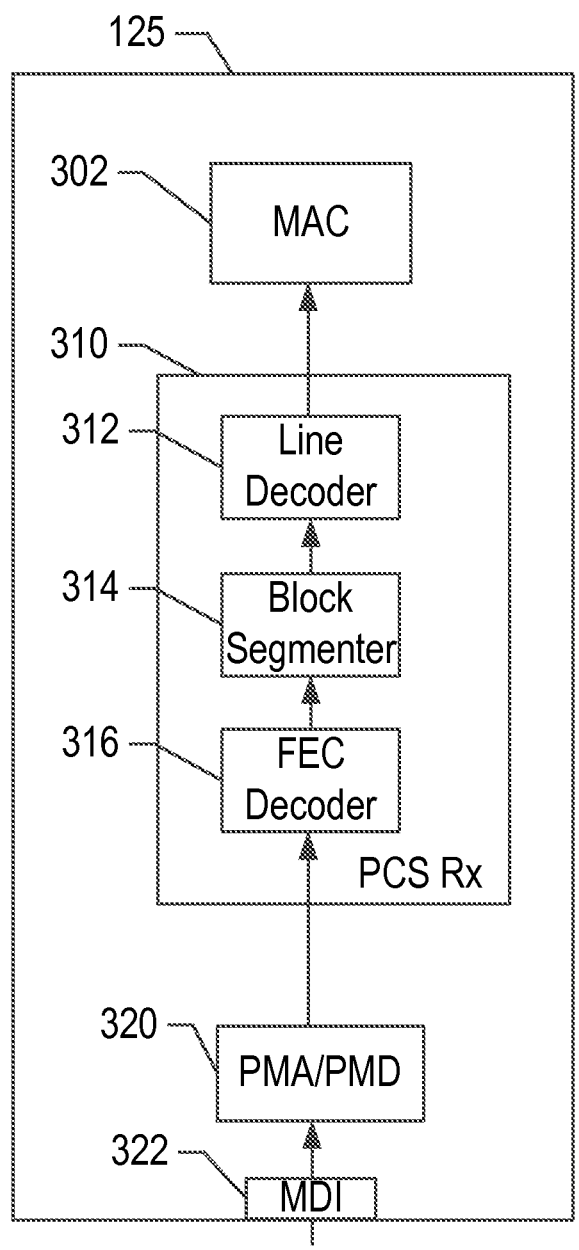
FIG. 3 illustrates an example cable line terminal (CLT) in accordance with one or more implementations.

FIG. 3 illustrates an example cable line terminal (CLT) 125 in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided. In one or more implementations, one or more of the components of the CLT 125 illustrated in FIG. 3 may be used by the media converter 135, and/or other devices.

The CLT 125 includes a MAC module 302, a PCS receive (Rx) module 310, a line decoder 312, a block segmenter 314, an FEC decoder 316, a PMA/PMD module 320, and an MDI 322. In one or more implementations, the FEC decoder 316 may be an LDPC FEC decoder.

The PMA/PMD 320 receives a data stream over the MDI 322 and provides the data stream to the PCS Rx module 310. The PCS Rx module 310 may process the data stream to parse the codewords and provide the codewords to the FEC decoder 316. The FEC decoder 316 decodes the codewords into blocks and provides the blocks to the block segmenter 314. The block segmenter 314 segments the blocks into encoded blocks and provides the blocks to the line decoder 312. In one or more implementations, the line decoder 312 is a 64B/66B line decoder that receives 65-bit shortened line encoded blocks from the block segmenter 314 and provides 64 bits of data to the MAC module 302. The PCS Rx module 310, and its components, are discussed further below with respect to FIGS. 6A-B and 7.

In one or more implementations, one or more of the MAC module 302, the PCS Rx module 310, the line decoder 312, the block segmenter 314, and/or the FEC decoder 316 may be implemented in software (e.g., subroutines and code). In one or more implementations, one or more of the MAC module 302, the PCS Rx module 310, the line decoder 312, the block segmenter 314, the FEC decoder 316, the PMA/PMD module 320, and/or the MDI 322 may be implemented in hardware (e.g., an ASIC, an FPGA, a PLD, a controller, a state machine, gated logic, discrete hardware components, or any other suitable devices) and/or a combination of both. Additional features and functions of these modules according to various aspects of the subject technology are further described in the present disclosure.

Figure 4A:
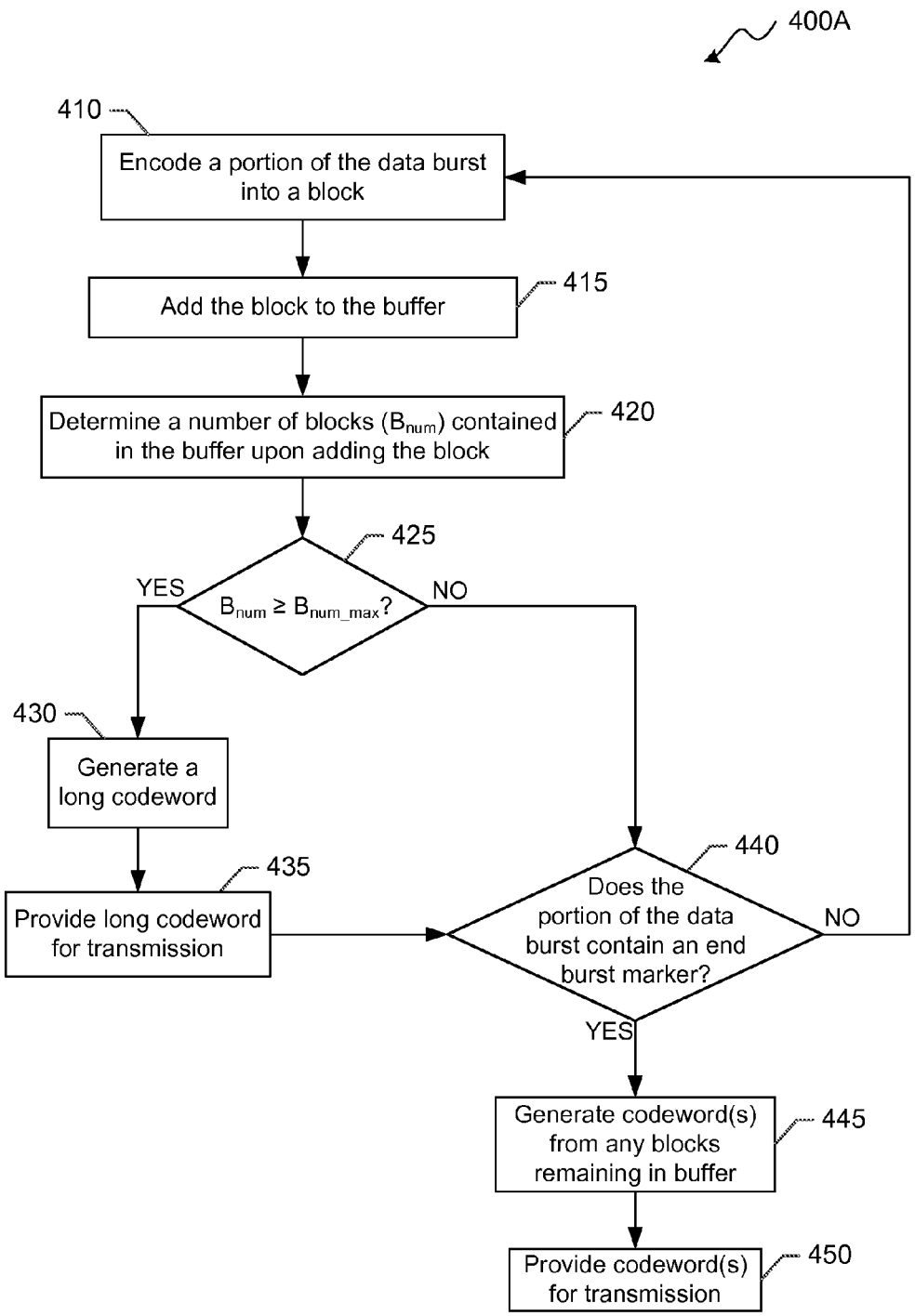
FIG. 4A illustrates a flow diagram of an example process of a codeword filling system in accordance with one or more implementations.

FIG. 4A illustrates a flow diagram of an example process 400A of a codeword filling system in accordance with one or more implementations. For explanatory purposes, the example process 400A is primarily described herein with reference to the CNU 130A of FIGS. 1-2; however, the example process 400A is not limited to the CNU 130A of FIGS. 1-2, e.g. the example process 400A may be performed by the CNU 130B and/or other devices, and/or the example process 400A may be performed by one or more different components of the CNU 130A. Further for explanatory purposes, the blocks of the example process 400A are described herein as occurring in serial, or linearly. However, multiple blocks of the example process 400A may occur in parallel. In addition, the blocks of the example process 400A may be performed in a different order than the order shown and/or one or more of the blocks of the example process 400A may not be performed.

The MAC module 202 of the CNU 130A provides data bursts to the PCS Tx module 210 of the CNU 130A. The line encoder 212 of the PCS Tx module 210 encodes at least a portion of a received data burst into a block (410). In one or more implementations, the portion may contain a start burst marker and/or an end burst marker, indicating a beginning and an end of the data burst, respectively. The start burst marker may be a fixed pattern, or one of multiple possible fixed patterns, contained in the data burst to provide a demarcation of a beginning of the data burst. The end burst marker may be a fixed pattern, or one of multiple possible fixed patterns, contained in the data burst to provide a demarcation of an end of the data burst. For example, the block aggregator 214 of the PCS Tx module 210 may monitor blocks received from the line encoder 212, and/or blocks stored in the buffer 218, to detect the start burst marker and/or the end burst marker. Alternatively, and/or in addition, the line encoder 212 of the PCS Tx module 210 (or any other component of the CNU 130A), may monitor each encoded portion of the data burst to detect the start burst marker and/or the end burst marker.

In one or more implementations, the blocks output by the line encoder 212 are a fixed size, such as a predetermined size, and the line encoder 212 is a 64B/66B line encoder that obtains a 64-bit portion of the data burst and adds a 2-bit sync header. Since the two bits of the sync header are complementary, one of the bits of the sync header may be removed by the line encoder 212 without loss of information to form a shortened sync header and yield a 65-bit block that is output by the line encoder 212.

The block aggregator 214 receives the block from the line encoder 212, and adds the block to the buffer 218 (415). The block aggregator 214 then determines the number of blocks contained in the buffer 218 upon adding the block (420), which may be denoted as $B_{num}$. In the first iteration through the example process 400, the value of $B_{num}$ is one. The block aggregator 214 determines whether $B_{num}$ is greater than or equal to a maximum number of blocks denoted as $B_{num\_max}$ (425). In one or more implementations, the maximum number of blocks may be predetermined and/or may refer to the largest number of blocks that can be used to generate a single codeword, such as 220 blocks of 65-bit blocks that can be used to generate a long codeword.

If the block aggregator 214 determines that $B_{num}$ is greater than or equal to $B_{num\_max}$ (425), the block aggregator 214 forms an FEC payload using $B_{num\_max}$ number of blocks from the buffer 218, and provides the FEC payload to the FEC encoder 216. The FEC encoder 216 (and/or additional cyclic redundancy check (CRC) circuitry) generates a long codeword from the FEC payload (430). The PCS Tx module 210 of the CNU 130A then provides the long codeword for transmission (435), such as to the media converter 135. In one or more implementations, the PMA/PMD module 220 of the CNU 130A performs additional PHY layer processing on the codeword prior to transmitting the codeword via the MDI 222 to the media converter 135. The PMA/PMD module 220 may receive blocks of the codeword one block at a time for processing.

If the block aggregator 214 determines that $B_{num}$ is less than $B_{num\_max}$ (425), a component of the PCS Tx module 210, such as the block aggregator 214 or the line encoder 212, determines whether the portion of the data burst contains the end burst marker of the data burst (440). If the portion of the data burst does not contain the end burst marker (440), steps 410-440 are repeated until a portion of the data burst containing the end burst marker is detected. If the portion of the data burst contains the end burst marker (440), the block aggregator 214 forms one or more FEC payloads using any remaining blocks in the buffer 218 (after removing the blocks used to generate the long codeword (430)), and the FEC encoder 216 generates one or more codewords from the FEC payloads (445). The FEC payloads formed, and the corresponding codewords generated from remaining blocks in the buffer 218, may be of varying sizes and/or combinations of sizes. The manner in which the block aggregator 214 determines the number and size of FEC payloads to form, and consequently the number and size of the codewords that are generated (445), is discussed further below with respect to FIG. 4B. If any codewords are generated, they are subsequently provided for transmission (450), such as to the media converter 135.

Figure 4B:
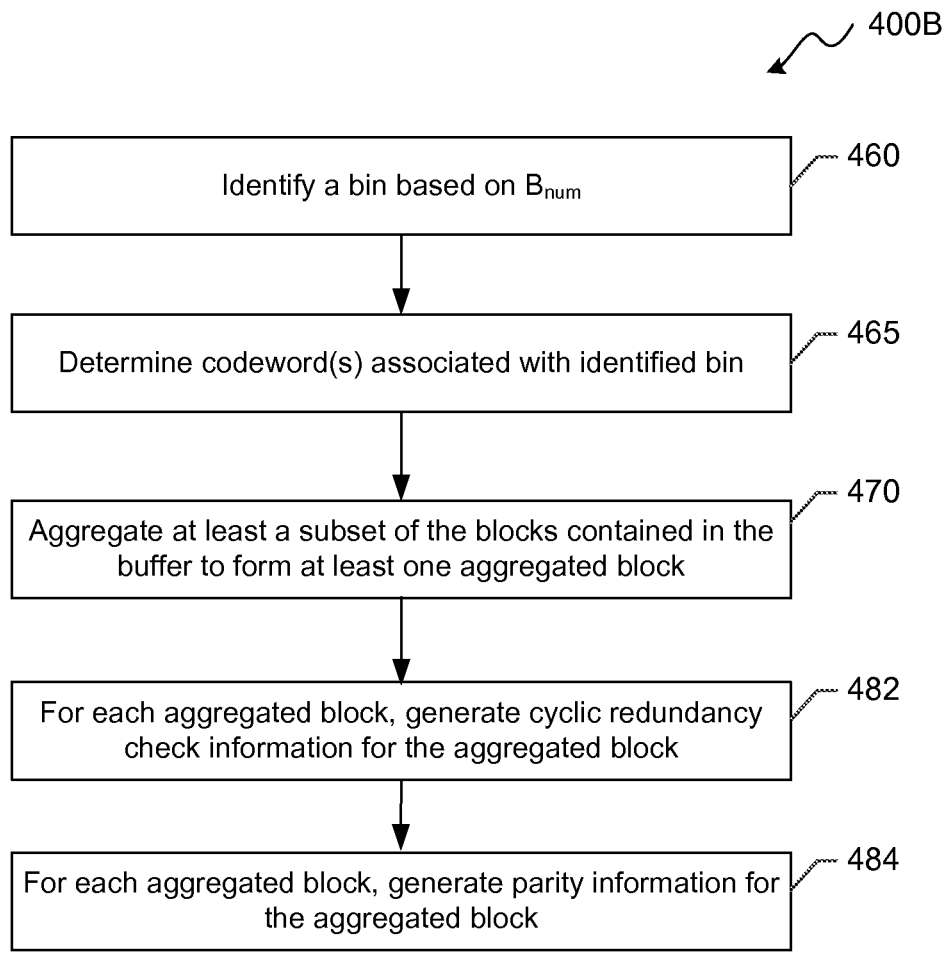
FIG. 4B illustrates a flow diagram of an example process of generating codeword(s) from remaining block(s) of a data burst in a codeword filling system in accordance with one or more implementations.

FIG. 4B illustrates a flow diagram of an example process 400B of generating codeword(s) from remaining block(s) of a data burst in a codeword filling system in accordance with one or more implementations. For explanatory purposes, the example process 400B is primarily described herein with reference to the block aggregator 214 of the CNU 130A of FIGS. 1-2; however, the example process 400B is not limited to the block aggregator 214 or the CNU 130A of FIGS. 1-2, e.g. the example process 400B may be performed by the CNU 130B and/or other devices, and/or the example process 400B may be performed by one or more different components of the CNU 130A. Further for explanatory purposes, the blocks of the example process 400B are described herein as occurring in serial, or linearly. However, multiple blocks of the example process 400B may occur in parallel. In addition, the blocks of the example process 400B may be performed in a different order than the order shown and/or one or more of the blocks of the example process 400B may not be performed.

The example process 400B may be used in conjunction with step 445 of the example process 400A, for example, when the end burst marker is detected and there are blocks remaining in the buffer 218 after removing any blocks used to generate a long codeword. In particular, the example process 400B may be used by the block aggregator 214 to determine the size and number of codewords to generate from the blocks remaining in the buffer 218 when the end burst marker is detected. The codewords that may be generated from the remaining blocks include, for example, a shortened short codeword, a short codeword, a shortened medium codeword, a medium codeword, and/or a shortened long codeword.

Table 1 provides examples of sizes of some of the aforementioned codewords that can be generated by the FEC encoder 216 of the CNU 130A.

The first row of Table 1 corresponds to the long codeword that is generated at step 430 of the example process 400A. The long codeword may have 16,200 total bits with 14,400 information bits (including 40 CRC bits) and 1,800 parity bits. In one or more implementations, the long codeword may be referred to as a maximum-sized codeword, as it is the largest size codeword that may be generated by the CNU 130A in Table 1. The second row of Table 1 corresponds to a medium codeword of 5,940 total bits with 5,040 information bits (including 40 CRC bits) and 900 parity bits, and the third row of Table 1 corresponds to a short codeword of 1,120 total bits with 840 information bits (including 40 CRC bits) and 280 parity bits. The rate of a codeword may be computed using the equation $$\text{Rate} = \frac{(K - CRC)}{N},$$

where K is the number of information bits in the codeword, CRC is the number of CRC bits in the codeword, and N is the total number of bits in the codeword.

The size and/or number of codewords selected by the block aggregator 214 at step 445 of the example process 400A may depend on the number (and size) of blocks remaining in the buffer 218 when the end burst marker is detected. Table 2 provides examples of codewords generated by the FEC encoder 216 when the blocks in the buffer 218 are 65-bit blocks.

TABLE 2

Codeword generated from 65-bit blocks by the CNU 130A

| Codeword (N,K) (bits) | Max Info (65-bit blocks) | Max Info (bits) | Information Pad (bits) | Parity + CRC (bits) | Codeword (bits) | Rate |
|---|---|---|---|---|---|---|
| (16200, 14400) | 220 | 14300 | 60 | 1840 | 16140 | 0.88599752 |
| (5940, 5040) | 76 | 4940 | 60 | 940 | 5880 | 0.84013605 |
| (1120, 840) | 12 | 780 | 20 | 320 | 1100 | 0.70909091 |

With reference to Table 2, the long codeword includes a maximum of 14,300 information bits consisting of 220 65-bit information blocks; 40 CRC bits; and 1,800 parity bits for a total codeword length of 16,140 bits. In one or more implementations, 60 bits of zero padding is added to the information blocks plus CRC for encoding the 1,800 parity bits only, and the padding is removed after encoding prior to transmission of the 16,140 bit codeword. Table 2 provides similar information for the medium and small codewords.

The block aggregator 214 may utilize the example threshold values (in bits) of Table 3 to classify the number of information bits contained in the buffer 218, excluding CRC bits, into bins represented by the index value of each row.

TABLE 1

Codeword sizes generated by the CNU 130A

| Codeword (N, K) (bits) | Info K | Parity N-K | CRC | Info-CRC | Parity + CRC | Codeword | Rate |
|---|---|---|---|---|---|---|---|
| (16200, 14400) | 14400 | 1800 | 40 | 14360 | 1840 | 16200 | 0.88641975 |
| (5940, 5040) | 5040 | 900 | 40 | 5000 | 940 | 5940 | 0.84175084 |
| (1120, 840) | 840 | 280 | 40 | 800 | 320 | 1120 | 0.71428571 |

TABLE 3

Encoding and decoding threshold values (in bits)

| | Encode (bits) | | Decode (bits) | |
|---|---|---|---|---|
| I | Threshold | ΔThreshold | Threshold | ΔThreshold |
| 0 | 780 | 780 | 1100 | 1100 |
| 1 | 1560 | 780 | 2200 | 1100 |
| 2 | 4940 | 3380 | 5880 | 3680 |
| 3 | 5720 | 780 | 6980 | 1100 |
| 4 | 6500 | 780 | 8080 | 1100 |
| 5 | 14300 | 7800 | 16140 | 8060 |

The bins identified in Table 3 may be sized based at least in part on the sizes of the long, medium, and short codewords identified in Tables 1 and 2. Each bin is associated with a respective lower bit number threshold and a respective upper bit number threshold. For example, bin 0 may be set to 780 bits based on the size of the short codeword (e.g., the number of information bits for the short codeword excluding 40 CRC bits), whereas bin 1 may be set to 1,560 bits based on the size of two short codewords. Bin 0 has a respective lower bit number threshold of 1 bit and a respective upper bit number threshold of 780 bits, whereas bin 1 has a respective lower bit number threshold of 781 bits and a respective upper bit number threshold of 1,560 bits. The value of Δthreshold provides the change in the threshold value between bins.

The block aggregator 214 may then utilize the bin classification of the number of bits identified in Table 3, in conjunction with Table 4, to determine a size and/or number of codewords to be generated. Table 4 provides a size and/or number of codewords that are associated with, or mapped to, each of the bin classifications identified in Table 3. Thus, Table 4 effectively provides a mapping between numbers of bits and sets of codewords.

TABLE 4

Number and type/size of codewords to be generated

| I | CW_Buffer[ ] |
|---|---|
| 0 | shortened SHORT |
| 1 | full SHORT; shortened SHORT |
| 2 | shortened MEDIUM |
| 3 | full MEDIUM; shortened SHORT |
| 4 | full MEDIUM; full SHORT; shortened SHORT |
| 5 | shortened LONG |

With reference to Tables 3 and 4, bin 0 is associated with an encoding threshold of 780 bits and a short codeword. Thus, if the number of information bits contained in the buffer 218 is less than 780 bits, then the block aggregator 214 may provide the information bits to the FEC encoder 216 in an FEC payload for generating a short codeword. In bin 0, the short codeword may be referred to as a shortened short codeword because the codeword does not contain the maximum number of information bits possible for the short codeword. The block aggregator 214 then adds the 40-bit CRC computed over the information bits and zero pads a portion of the FEC payload for generating the shortened short codeword parity bits. The zero pad is removed from the codeword that is provided for transmission.

The bins of Tables 3 and 4 may be provided in terms of blocks. Each bin has respective lower block number threshold and a respective upper block number threshold. In terms of 65-bit blocks, bin 0 allows for a maximum of 12 information blocks, or 780 information bits (e.g., a lower block number threshold of 1 block and an upper block number threshold of 12 blocks). When the number of 65-bit blocks exceeds 12 information blocks, such as 13 information blocks, the bin classification will roll to bin 1 which is associated with one full short codeword and one shortened short codeword. As another example, if the number of information bits contained in the buffer falls into bin 4 (between 5,720 bits and 6,500 bits), the associated codewords to be generated include a full medium codeword, a full short codeword, and a shortened short codeword. If the number of information bits exceeds 14,360 bits, a full long codeword may be generated from each portion of 14,300 information bits in the buffer 218, and the number of remaining bits contained in the buffer may be classified into one of the bins shown in Tables 3 and 4. Thus, the number of the codewords and the type/size of codewords are based on the size of the data burst.

The encoding process uses the encoding thresholds to encode the information into the transmitted codewords. The decoding process uses the decoding thresholds to decode the information from the received codewords.

When the end burst marker is detected and there are a number of blocks ($B_{num}$) remaining in the buffer 218, the block aggregator 214 identifies a bin from Table 3 based on the size and number of blocks remaining in the buffer 218 (460). The block aggregator 214 then determines the codeword(s) associated with the bin, as indicated in Table 4 (465). Based on the size of the determined codeword(s) (465), the block aggregator 214 aggregates at least some of the blocks contained in the buffer 218 to form at least one aggregated block (e.g., an FEC payload) to be utilized in generating the codeword (470). In one or more implementations, the number of aggregated blocks (or FEC payloads) is the same as the number of codewords to be generated.

The PCS Tx module 210 of the CNU 130A generates cyclic redundancy check information (482) and parity information (484) for each of the aggregated blocks. In one or more implementations, each codeword is generated from the respective aggregated block and respective data verification information. In one or more implementations, the data verification information includes CRC information generated by CRC circuitry of the PCS Tx module 210 (482), and parity information generated by the FEC encoder 216 (484). The CRC information may be generated based on the aggregated block (482), and the parity information may be generated based on the aggregated block and the CRC information (484). In such implementations, each codeword contains the respective aggregated block, CRC information, and parity information. In one or more implementations, each codeword may include padding (e.g., zero padding) in order for the codeword or portions of the codeword (e.g., a last block of the aggregated block) to be of a certain size. In one or more implementations, the CNU 130A generates multiple codewords, where each codeword may be generated by performing the blocks 470, 482, and 484.

In one or more implementations, the block aggregator 214 and/or the PCS Tx module 210 of the CNU 130A may implement the subject technology by storing in memory, and executing, the following encoding pseudocode:

0) Initialization
   Δthreshold[0:5]; threshold = Δthreshold[0]; #bits = 0; I = 0
1) Find start Burst Marker

```
2) Get next block
   add to CW_Buffer[ ]; #bits = #bits + 65
3) If end Burst Marker found
   Go to step 7
4) If #bits > threshold
   I = I + 1 modulo 6; threshold = threshold + Δthreshold[I]
   Else Go to step 2
5) If I = 0
   Encode and output Long Codeword in CW_Buffer[ ];
   reset CW_Buffer[ ]
6) If end Burst Marker not found
   Go to step 2
7) Encode and output Codewords in CW_Buffer[ ] using value of I
```

The pseudocode may be utilized with the encoding bins provided in Tables 3 and 4, which may also be stored in memory. In the pseudocode, CW_Buffer[ ] refers to the blocks contained in the buffer (e.g., the buffer 218). In one or more implementations, the resetting of the buffer may include removing some, but not all, of the blocks contained in the buffer, such as removing the blocks utilized to generate a codeword (e.g., a full long codeword) while retaining any remaining blocks in the buffer.

Figure 5:
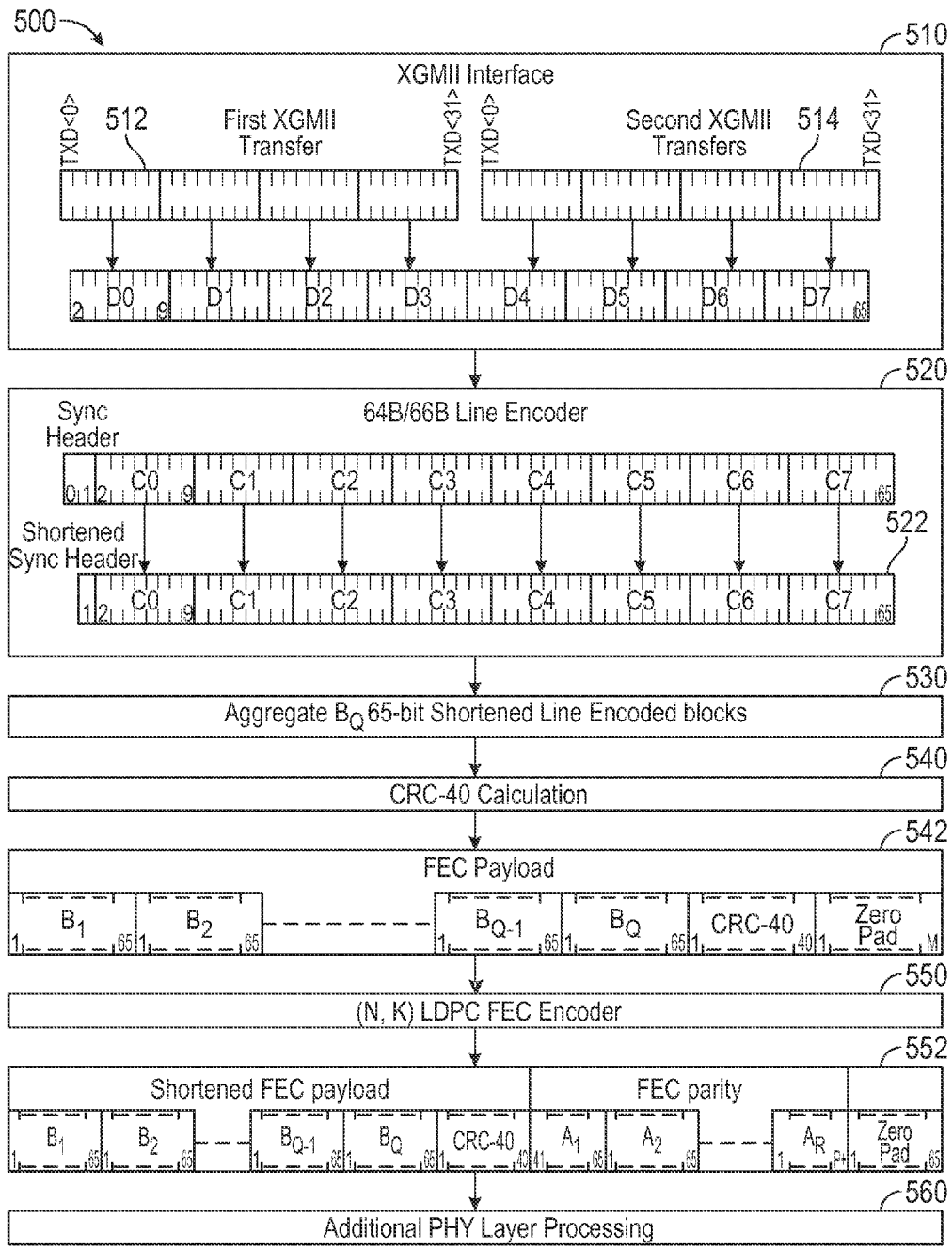
FIG. 5 illustrates an encoding architecture in accordance with one or more implementations.

FIG. 5 illustrates an example encoding architecture 500 in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided. For explanatory purposes, the example encoding architecture 500 may be utilized in the CNU 130A; however, the same and/or similar components may be used in the CNU 130B, and other CNUs.

Portions of a data burst may be provided, one portion at a time, to a media independent interface, such as a 10 Gigabit Media Independent Interface (XGMII) 510, from a MAC layer (e.g., the MAC module 202) of the CNU 130A. The MAC layer of the CNU 130A may receive Ethernet frames that include the data burst. Each portion of the data burst may be provided as part of two four-octet transfers 512 and 514 on the XGMII 510 to a line encoder 520. In such implementations, each portion of the data burst has a length of 64 bits and the line encoder 520 is a 64B/66B line encoder that receives/encodes a 64-bit portion of the data burst and generates a 65-bit block 522.

A block aggregator 530 may aggregate the encoded blocks. The block aggregator 530 may be coupled to, and/or may include, a buffer (not shown). The block aggregator 530 may monitor blocks received from the line encoder 520 and/or stored in the buffer, for the start burst marker and/or the end burst marker. The block aggregator 530 may determine the number of blocks contained in the buffer and/or may determine whether the number of blocks contained in the buffer exceeds a predetermined maximum number of blocks.

A codeword may be generated from an aggregated block using a CRC circuitry 540 to generate an FEC payload 542 and using an FEC encoder 550 to generate a codeword 552 based on the FEC payload 542. The CNU 130A provides for transmission the generated codeword to the media converter 135. The CNU 130A may perform additional PHY layer processing, using a circuitry 560, on the codeword 552 prior to transmitting the codeword 552 to the media converter 135. The circuitry 560 may be part of a PMA/PMD module (e.g., the PMA/PMD module 220).

Figure 6A:
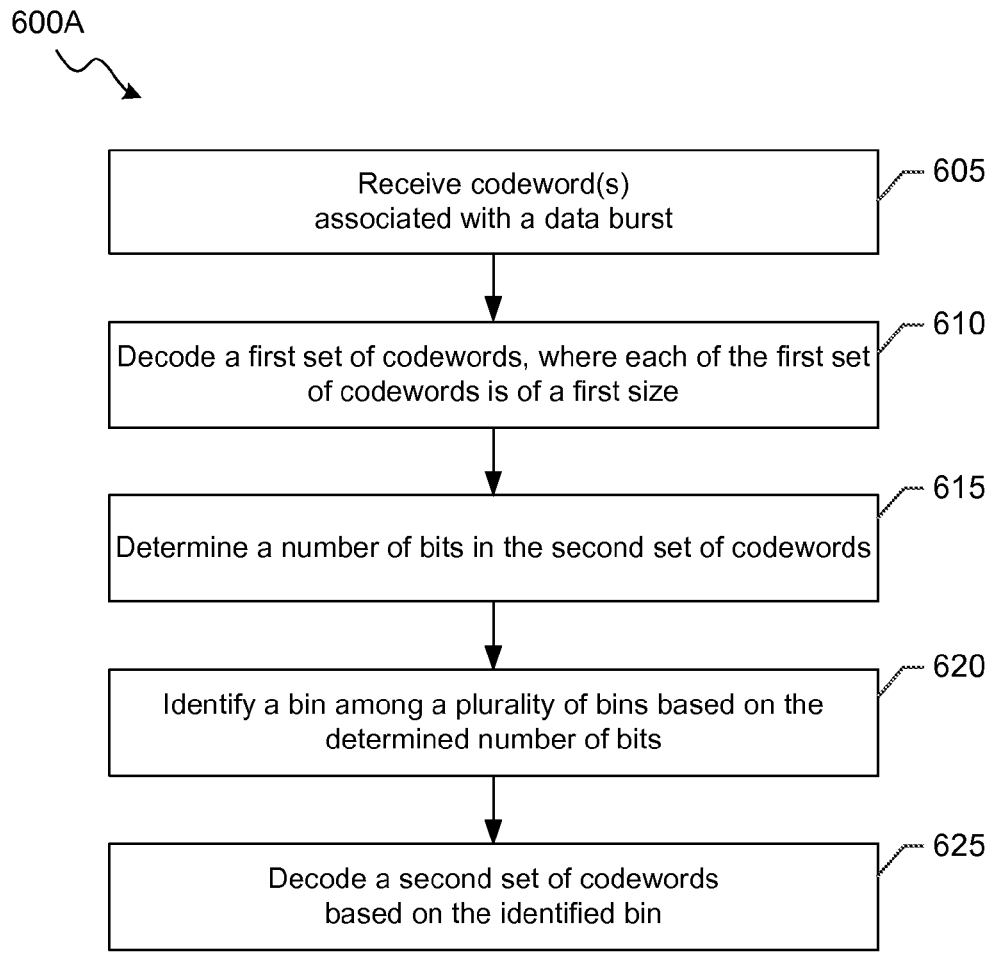
FIG. 6A illustrates a flow diagram of an example process for decoding a data burst in accordance with one or more implementations.

FIG. 6A illustrates a flow diagram of an example process 600A for decoding a data burst in accordance with one or more implementations. For explanatory purposes, the example process 600A is primarily described herein with reference to the CLT 125 of FIGS. 1 and 3; however, the example process 600A is not limited to the CLT 125 of FIGS. 1 and 3, e.g. the example process 600A may be performed by the media converter 135 and/or other devices, and/or the example process 600A may be performed by one or more components of the CLT 125. Further for explanatory purposes, the blocks of the example process 600A are described herein as occurring in serial, or linearly. However, multiple blocks of the example process 600A may occur in parallel. In addition, the blocks of the example process 600A may be performed in a different order than the order shown and/or one or more of the blocks of the example process 600A may not be performed.

The CLT 125 receives codewords associated with a data burst from the CNU 130B (605). The codewords may include information bits, CRC bits, and parity bits. In one or more implementations, the codewords may be generated from blocks (e.g., 65-bit blocks), including one or more information blocks, CRC blocks, and parity blocks. In one or more implementations, the PMA/PMD module 320 performs PHY layer processing on data received from the CNU 130B.

The FEC decoder 316 of the CLT 125 decodes a first set of codewords associated with the data burst (610). In one or more implementations, the codewords in the first set of codewords, if any, are of a predetermined maximum size of a codeword that may be transmitted between CLT 125 and CNU 130B. With reference to Table 1, the predetermined maximum size of a codeword may be 16,200 bits, which is the codeword size of the long codeword. The number of codewords in the first set of codewords may be the integer portion obtained from dividing the number of bits of the data burst by the predetermined maximum size of a codeword.

The PCS Rx module 310 of the CLT 125 determines the number of bits in a second set of codewords associated with the data burst (615). In one or more implementations, the number of bits in the second set of codewords is the remaining bits of the data burst after decoding the first set of codewords (610). The codewords of the second set of codewords may be of different sizes, which the PCS Rx module 310 may not have a priori knowledge of Thus, in order to determine the codewords contained in the second set of codewords, the PCS Rx module 310 identifies a bin based on the determined number of bits of the second set of codewords (620). In one or more implementations, the number of bits may be compared to the decode threshold values provided in Table 3 and the associated codeword size/type provided in Table 4. For example, when the number of bits of the second set of codewords is between 7,060 bits and 8,180 bits, Table 4 indicates that the second set of codewords includes a full medium codeword, a full short codeword, and a shortened short codeword. The FEC decoder 316 of the CLT 125 decodes the second set of codewords using the codewords associated with the identified bin (625).

Figure 6B:
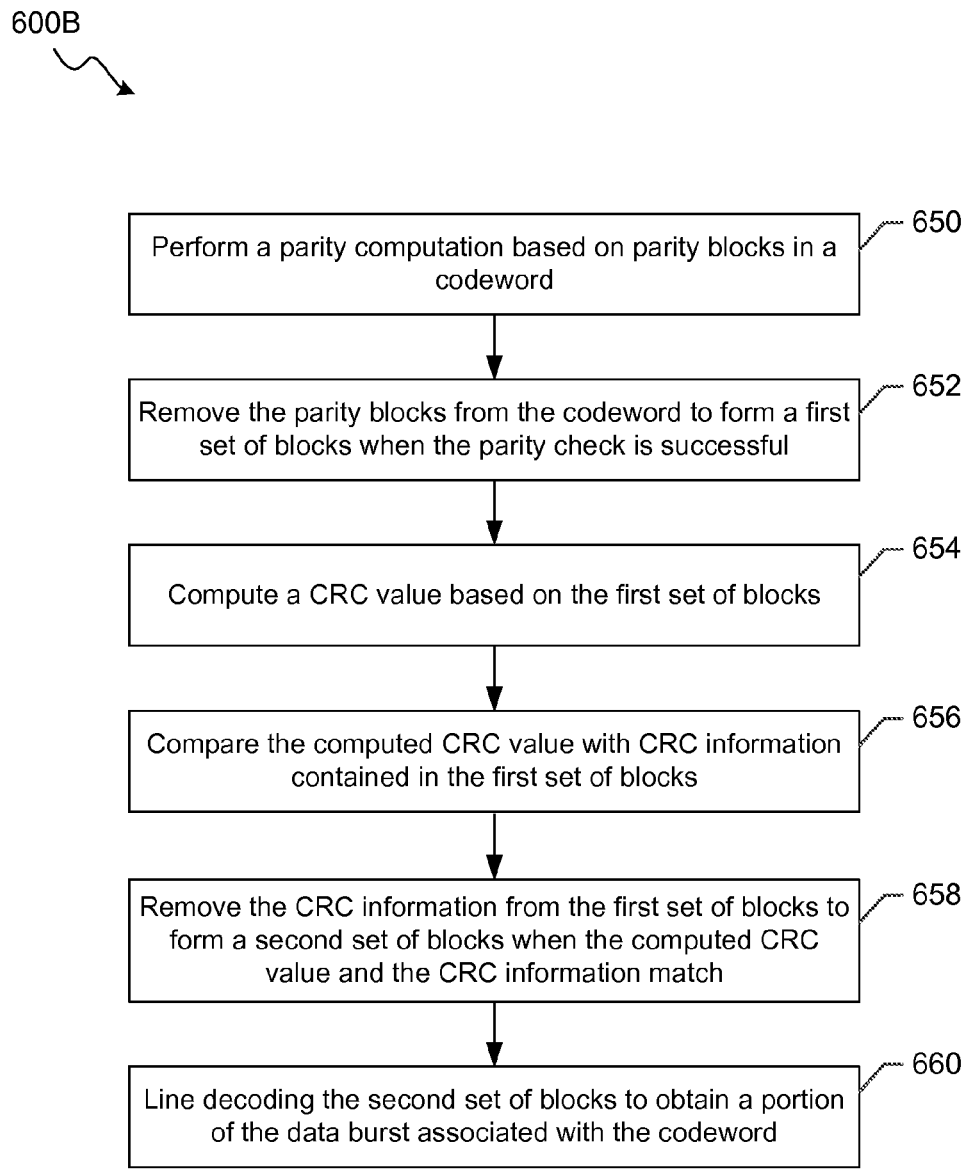
FIG. 6B illustrates a flow diagram of an example process for decoding codewords in accordance with one or more implementations.

FIG. 6B illustrates a flow diagram of an example process 600B for decoding codewords in accordance with one or more implementations. For explanatory purposes, the example process 600B is primarily described herein with reference to the CLT 125 of FIGS. 1 and 3; however, the example process 600B is not limited to the CLT 125 of FIGS. 1 and 3, e.g. the example process 600B may be performed by the media converter 135 and/or other devices, and/or the example process 600B may be performed by one or more components of the CLT 125. Further for explanatory purposes, the blocks of the example process 600B are described herein as occurring in serial, or linearly. However, multiple blocks of the example process 600B may occur in parallel. In addition, the blocks of the example process 600B may be performed in a different order than the order shown and/or one or more of the blocks of the example process 600B may not be performed.

In one or more implementations, the example process 600B may be utilized in the decoding each codeword of the first set of codewords (610) and/or decoding each codeword of the second set of codewords (625) in the example process 600A. The FEC decoder 316 performs a parity computation based on the parity blocks in the codeword (650) and removes the parity blocks from the codeword to form a first set of blocks when the parity check is successful (652). A CRC circuitry may be utilized to compute a CRC value based on the first set of blocks (654) and compares the computed CRC value with the CRC bits contained in the first set of blocks (656). The CRC circuitry removes the CRC bits from the first set of blocks to form a second set of blocks when the computed CRC value matches the CRC bits contained in the first set of blocks (658). In one or more implementations, the codeword includes 40 CRC bits.

The line decoder 312 decodes the second set of blocks to obtain a portion of the data burst associated with the codeword (660). In one or more implementations, the block segmenter 314 provides the line decoder 312 with one block of the second set of blocks at a time. In one or more implementations, blocks provided to the line decoder 312 are of a predetermined size (e.g., 65 bits). In one or more implementations, the line decoder 312 is a 64B/66B line decoder that receives 65-bit blocks from the block segmenter 314. Since the two bits of the sync header are complementary, the 64B/66B line decoder may generate the second sync header bit from the first sync header bit included in the block. The line decoder 312 removes the sync header and provides the decoded portion of the data burst associated with the block of the codeword. In one or more implementations, the decoded portion may be provided to the MAC module 302 as 64 bits of data obtained from the codeword.

In one or more implementations, the block segmenter 314 and/or the PCS Rx module 310 of the CLT 125 or the media converter 135 may implement the subject technology by storing in memory, and executing, the following decoding pseudocode:

```
0) Initialization
   Δthreshold[0:5]; threshold = Δthreshold[0]; #bits = 0; I = 0
1) Find start Burst Marker
2) Get next bit
   add to CW Buffer[ ]; #bits = #bits + 1
3) If end Burst Marker found
   Go to step 7
4) If #bits > threshold
   I = I + 1 modulo 6; threshold = threshold + Δthreshold[I]
   Else Go to step 2
5) If I = 0
   Decode and output Info in CW_Buffer[ ]; reset CW_Buffer[ ]
6) If end Burst Marker not found
   Go to step 2
7) Decode and output Info in CW_Buffer[ ] using value of I
```

The pseudocode may be utilized with the decoding bins provided in Tables 3 and 4, which may also be stored in memory. In the pseudocode, CW_Buffer[ ] refers to the bits contained in a buffer (not shown) coupled to and/or included in the block segmenter 314. In one or more implementations, the resetting of the buffer may include removing some, but not all, of the bits contained in the buffer, such as removing the bits utilized to decode information in a codeword (e.g., the information in a full long codeword) while retaining any remaining bits in the buffer.

Figure 7:
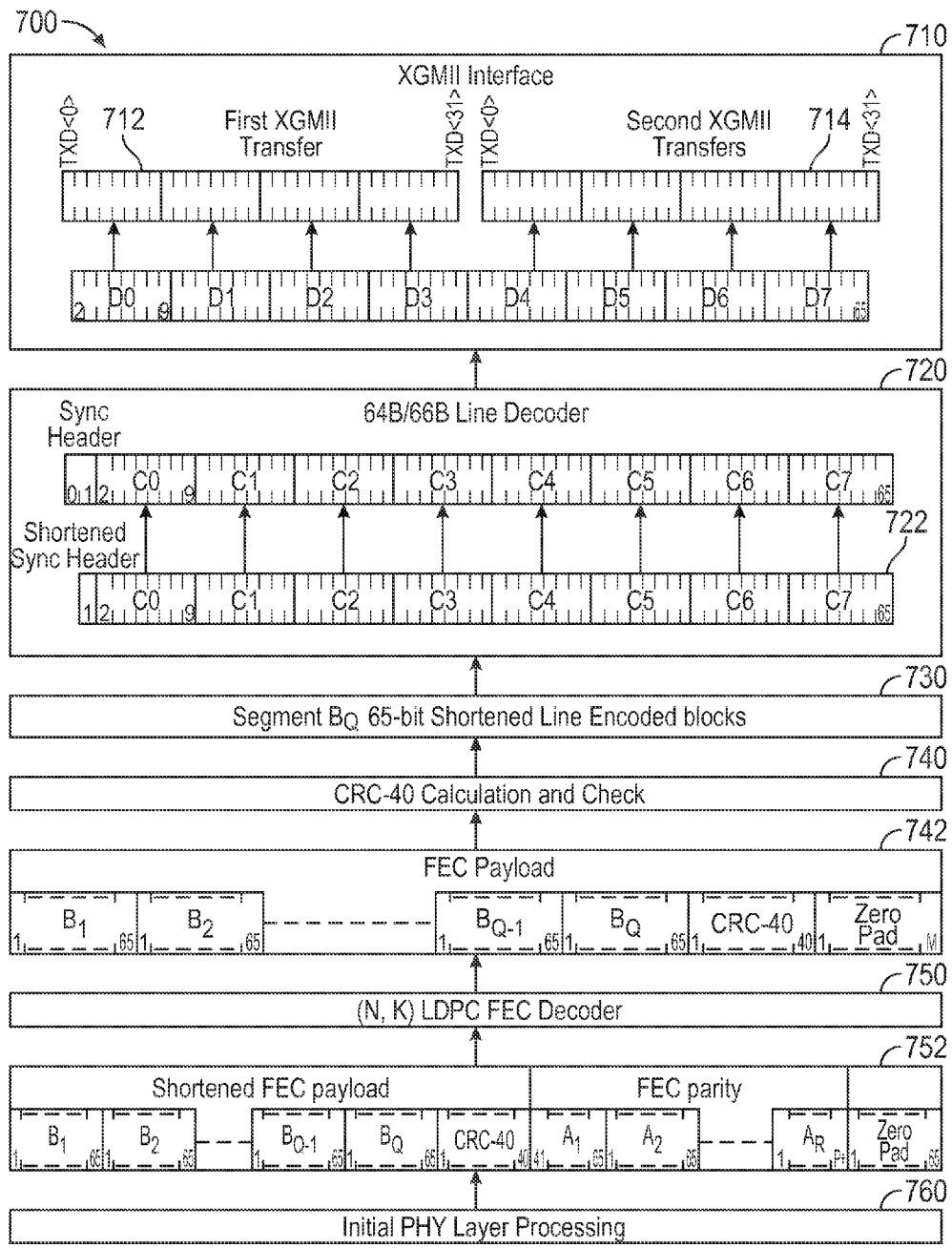
FIG. 7 illustrates a decoding architecture in accordance with one or more implementations.

FIG. 7 illustrates an example decoding architecture 700 in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided. For explanatory purposes, the example encoding architecture 500 may be utilized in the CLT 125; however, the same and/or similar components may be used in the media converter 135, and other CLTs and/or media converters.

The CLT 125 receives codewords associated with a data burst from the CNU 130B. In one or more implementations, the CLT 125 performs PHY layer processing using a circuitry 760 on received data from the CNU 130B to provide, for decoding, codewords (e.g., the codeword 752) associated with the data burst. The codewords may include information bits, CRC bits, and parity bits. In one or more implementations, the codewords may be formed of blocks (e.g., 65-bit blocks), including one or more information blocks, CRC blocks, and parity blocks.

An FEC decoder 750 may decode the codeword 752 to generate an FEC payload 742. A CRC circuitry 740 may generate an aggregated block from the FEC payload 742. A block segmenter 730 may generate one or more blocks (e.g., a block 722) based on the aggregated block. A line decoder 720 may decode blocks from the block segmenter 730 one block at a time to generate data associated with the data burst. An XGMII 710 may receive the decoded data from the line decoder 720. In one or more implementations, the block segmenter 730 may segment the aggregated block into a maximum number of 65-bit blocks possible from the aggregated block, and the line decoder 720 may generate 64 bits of data associated with the data burst based on each block from the block segmenter 730. In such implementations, the 64 bits of data may be provided as two four-octet transfers 712 and 714 on the XGMII 710, where the four-octet transfers 712 and 714 may be provided to a MAC layer (e.g., the MAC module 302) of the CLT 125.

Figure 8:
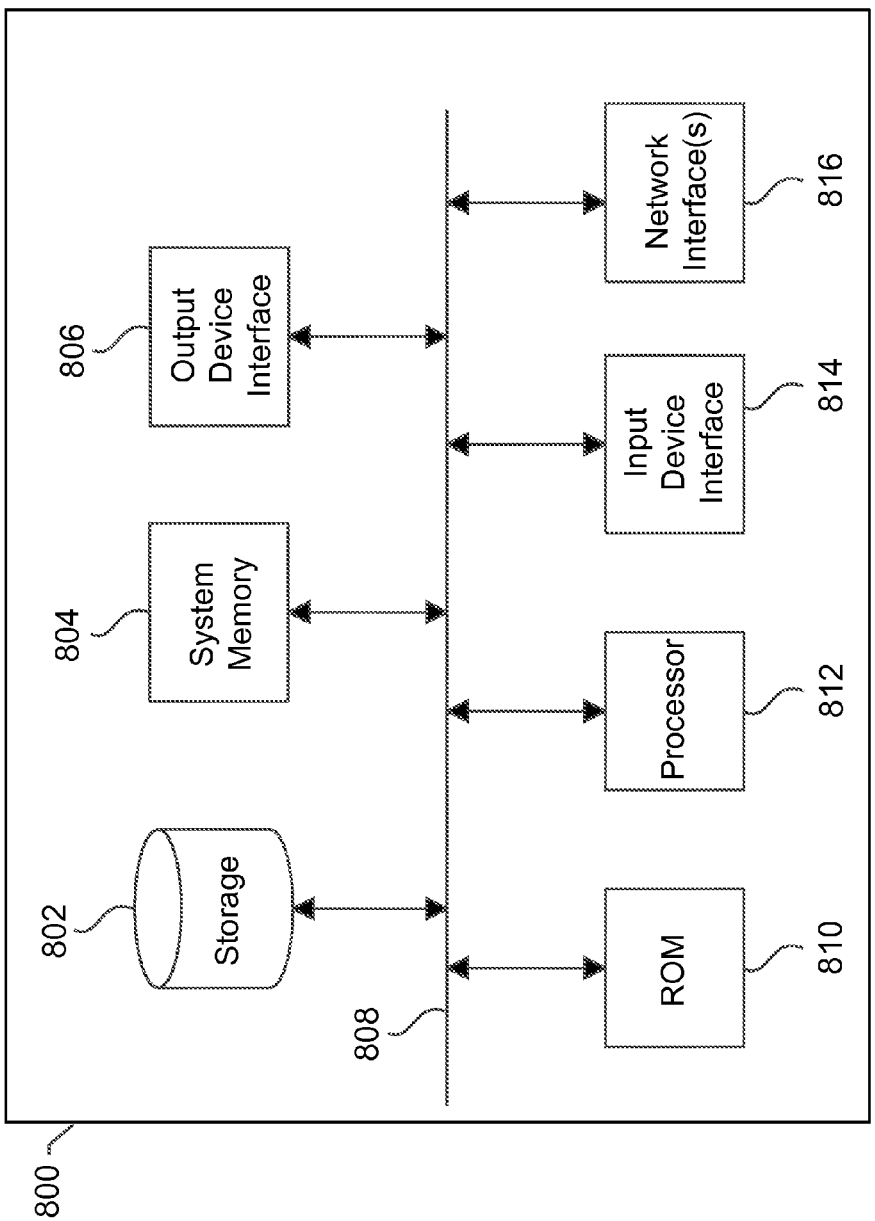
FIG. 8 conceptually illustrates an electronic system with which aspects of the subject technology may be implemented.

FIG. 8 conceptually illustrates an electronic system 800 with which one or more implementations of the subject technology may be implemented. The electronic system 800, for example, can be a desktop computer, a laptop computer, a tablet computer, a server, a switch, a router, an integrated access device, a multiplexer, a base station, a receiver, a phone, a personal digital assistant (PDA), or generally any electronic device that transmits signals over a network. The electronic system 800 can be, and/or can be a part of, one or more of the CNUs 130A-B, CLT 125, and/or media converter 135 shown in FIG. 1. Such an electronic system includes various types of computer readable media and interfaces for various other types of computer readable media. The electronic system 800 includes a bus 808, one or more processing unit(s) 812, a system memory 804 (e.g., the buffer 218), a read-only memory (ROM) 810, a permanent storage device 802, an input device interface 814, an output device interface 806, and one or more network interfaces 816, or subsets and variations thereof.

The bus 808 collectively represents all system, peripheral, and chipset buses that communicatively connect the numerous internal devices of the electronic system 800. In one or more implementations, the bus 808 communicatively connects the one or more processing unit(s) 812 with the ROM 810, the system memory 804, and the permanent storage device 802. From these various memory units, the one or more processing unit(s) 812 retrieves instructions to execute and data to process in order to execute the processes of the subject disclosure. The one or more processing unit(s) 812 can be a single processor or a multi-core processor in different implementations.

The ROM 810 stores static data and instructions that are needed by the one or more processing unit(s) 812 and other modules of the electronic system 800. The permanent storage device 802, on the other hand, may be a read-and-write memory device. The permanent storage device 802 may be a non-volatile memory unit that stores instructions and data even when the electronic system 800 is off. In one or more implementations, a mass-storage device (such as a magnetic or optical disk and its corresponding disk drive) may be used as the permanent storage device 802.

In one or more implementations, a removable storage device (such as a floppy disk, flash drive, and its corresponding disk drive) may be used as the permanent storage device 802. Like the permanent storage device 802, the system memory 804 may be a read-and-write memory device. However, unlike the permanent storage device 802, the system memory 804 may be a volatile read-and-write memory, such as random access memory. The system memory 804 may store any of the instructions and data that one or more processing unit(s) 812 may need at runtime. In one or more implementations, the processes of the subject disclosure are stored in the system memory 804, the permanent storage device 802, and/or the ROM 810. From these various memory units, the one or more processing unit(s) 812 retrieves instructions to execute and data to process in order to execute the processes of one or more implementations.

The bus 808 also connects to the input and output device interfaces 814 and 806. The input device interface 814 enables a user to communicate information and select commands to the electronic system 800. Input devices that may be used with the input device interface 814 may include, for example, alphanumeric keyboards and pointing devices (also called "cursor control devices"). The output device interface 806 may enable, for example, the display of images generated by electronic system 800. Output devices that may be used with the output device interface 806 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 8, the bus 808 also couples the electronic system 800 to one or more networks through the one or more network interface(s) 816. In this manner, the electronic system 800 can be a part of a network of computers (such as a LAN, a wide area network ("WAN"), or an Intranet, or a network of networks, such as the Internet. Any or all components of the electronic system 800 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration". Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device, comprising:
   at least one processor circuit configured to:
   receive portions of a data burst, arrange the portions into data blocks, and add the data blocks to a buffer;
   generate a first codeword from a first number of data blocks of the buffer when a number of data blocks in the buffer satisfies a threshold, remove the first number of data blocks from the buffer, and provide the first codeword for transmission, the buffer having a second number of data blocks remaining when the first number of data blocks are removed;
   generate a set of second codewords from the second number of data blocks of the buffer when a marker indicating an end of the data burst is detected, wherein at least one codeword of the set of second codewords is different in size from the first codeword; and
   provide the set of second codewords for transmission.

2. The device of claim 1, wherein the marker indicating the end of the data burst is detected before the number of data blocks in the buffer satisfies the threshold.

3. The device of claim 1, wherein the set of second codewords consists of a single codeword, or the set of second codewords comprises a plurality of codewords, each of the plurality of codewords comprising a different number of information bits.

4. The device of claim 1, wherein the second set of codewords comprises a plurality of codewords, each of the plurality of codewords having a different size.

5. The device of claim 1, wherein the at least one processor circuit is configured to determine a number of codewords in the set of second codewords, and a size of each codeword of the set of second codewords, based at least in part on a mapping between sets of codewords and numbers of bits.

6. The device of claim 5, wherein the at least one processor circuit is configured to determine the number of codewords in the set of second codewords, and the size of each codeword of the set of second codewords, by applying a number of bits of the second number of data blocks in the buffer to the mapping.

7. The device of claim 1, wherein the at least one processor circuit is further configured to:
identify a bin among a plurality of bins based on the number of data blocks contained in the buffer when the marker indicating the end of the data burst is detected, wherein:
each of the plurality of bins has a respective lower block number threshold and a respective upper block number threshold, and
a number of codewords in the set of second codewords is determined based at least on the identified bin.

8. The device of claim 1, wherein the at least one processor circuit is further configured to:
generate at least one cyclic redundancy check block based at least on a portion of the second number of data blocks; and
generate at least one parity block based at least on the portion of the second number of data blocks,
wherein at least one codeword of the set of second codewords is generated based at least on the portion of the remaining data blocks, the at least one cyclic redundancy check block, and the at least one parity block.

9. The device of claim 1, wherein the threshold corresponds to a number of data blocks used to generate a maximum-sized codeword.

10. The device of claim 1, wherein a number of codewords in the set of second codewords is based at least on the second number of data blocks of the buffer when the marker is detected.

11. The device of claim 1, wherein each of the data blocks consists of a fixed number of bits, and the at least one processor circuit is configured to detect the end of the data burst without a priori knowledge of a size of the data burst.

12. A method, comprising:
arranging a portion of a data burst into a first data block;
storing the first data block in at least one buffer, wherein the at least one buffer contains one or more data blocks associated with the data burst;
determining a number of data blocks contained in the at least one buffer upon storing the first data block;
determining whether the portion includes an end burst marker indicating an end of the data burst;
generating at least one codeword based at least on the determined number of data blocks and on whether the portion includes the end burst marker, wherein the at least one codeword is generated based at least on a subset of one or more data blocks contained in the at least one buffer upon storing the first data block; and
providing the at least one codeword for transmission.

13. The method of claim 12, further comprising:
identifying a bin among a plurality of bins based on the number of data blocks contained in the buffer when the portion of the data burst contains the end burst marker, wherein:
each of the plurality of bins has a respective lower block number threshold and a respective upper block number threshold, and
a number of codewords in the at least one codeword is based on the identified bin.

14. The method of claim 12, wherein:
the at least one buffer comprises the one or more data blocks and the first data block;
the at least one codeword comprises a first codeword when the determined number of data blocks in the buffer exceeds a predetermined maximum number of data blocks; and
the first codeword is based on the one or more data blocks of the data burst in the at least one buffer.

15. The method of claim 12, wherein:
the at least one buffer comprises the one or more data blocks and the first data block, and
each of the at least one codeword is of one of a plurality of predetermined sizes.

16. The method of claim 15, wherein the at least one codeword comprises a first codeword and a second codeword of a different size from the first codeword.

17. The method of claim 12, wherein a number of codewords in the at least one codeword is based at least on the determined number of data blocks and on whether the portion includes the end burst marker.

18. A computer program product comprising instructions stored in a non-transitory computer-readable storage medium, the instructions when executed by a computer, cause the computer to perform operations, the instructions comprising:
instructions to receive a data burst;
instructions to decode a first portion of the data burst as a first set of codewords, each of the first set of codewords has a first number of bits; and
instructions to decode a second portion of the data burst as a second set of codewords, wherein a number of codewords of the second set of codewords is determined based at least in part on a second number of bits of the second portion of the data burst, the second number of bits being less than the first number of bits.

19. The computer program product of claim 18, wherein instructions to code comprises, for each codeword:
instructions to perform a parity computation based on one or more parity blocks in the codeword;
instructions to remove the one or more parity blocks from the codeword to form a first set of blocks when the parity computation is successful;
instructions to compute a cyclic redundancy check (CRC) value based on the first set of blocks;
instructions to compare the computed CRC value with CRC information contained in the first set of blocks;
instructions to remove the CRC information from the first set of blocks to form a second set of blocks when the computed CRC value matches the CRC information; and
instructions to line decode the second set of blocks to obtain a portion of the data burst associated with the codeword.

20. The computer program product of claim 18, wherein the instructions further comprise:
instructions to determine a number of bits in the second set of codewords; and
instructions to identify a bin among a plurality of bins based on the determined number of bits, wherein:
each of the plurality of bins has a respective lower bit number threshold and a respective upper bit number threshold, and the number of codewords in the second set of codewords and a size associated with each codeword of the second set of codewords is determined based at least in part on the identified bin.

\* \* \* \* \*